United States Patent
Zou

(10) Patent No.: US 10,388,634 B2
(45) Date of Patent: Aug. 20, 2019

(54) MICRO-LED TRANSFER METHOD, MANUFACTURING METHOD AND DISPLAY DEVICE

(71) Applicant: Goertek, Inc., Shandong (CN)

(72) Inventor: Quanbo Zou, Shandong (CN)

(73) Assignee: Goertek, Inc., Shandong (CN)

( * ) Notice: Subject to any disclaimer, the term of this patent is extended or adjusted under 35 U.S.C. 154(b) by 0 days.

(21) Appl. No.: 15/986,812

(22) Filed: May 23, 2018

(65) Prior Publication Data
US 2019/0096859 A1  Mar. 28, 2019

Related U.S. Application Data

(63) Continuation of application No. PCT/CN2017/104036, filed on Sep. 28, 2017.

(51) Int. Cl.
| | | |
|---|---|---|
| H01L 21/00 | (2006.01) | |
| H01L 25/075 | (2006.01) | |
| H01L 33/62 | (2010.01) | |
| H01L 33/00 | (2010.01) | |

(52) U.S. Cl.
CPC ...... *H01L 25/0753* (2013.01); *H01L 33/0079* (2013.01); *H01L 33/62* (2013.01); *H01L 33/007* (2013.01); *H01L 2933/0066* (2013.01)

(58) Field of Classification Search
CPC . H01L 25/0753; H01L 33/0079; H01L 33/62; H01L 33/007; H01L 2933/0066
See application file for complete search history.

(56) References Cited

U.S. PATENT DOCUMENTS

| | | | |
|---|---|---|---|
| 7,221,044 B2 * | 5/2007 | Fan | ........................ H01L 27/153 257/676 |
| 8,415,771 B1 * | 4/2013 | Golda | ................. B81C 99/0025 257/621 |
| 2017/0025484 A1 | 1/2017 | Forrest et al. | |
| 2017/0309798 A1 | 10/2017 | Bonar et al. | |
| 2018/0069149 A1 | 3/2018 | Zou et al. | |

FOREIGN PATENT DOCUMENTS

| | | |
|---|---|---|
| CN | 101599418 A | 12/2009 |
| CN | 104617121 A | 5/2015 |
| CN | 106058010 A | 10/2016 |

OTHER PUBLICATIONS

PCT International Search Report and Written Opinion, Application No. PCT/CN2017/104036, dated May 28, 2018.

* cited by examiner

*Primary Examiner* — Richard A Booth
(74) *Attorney, Agent, or Firm* — Patent Law Works LLP

(57) ABSTRACT

A micro-LED transfer method, manufacturing method and display device are disclosed. The method comprises: coating conductive photoresist on a receiving substrate, wherein the conductive photoresist is positive-tone photoresist; bonding a carrier substrate with the receiving substrate via the conductive photoresist, wherein metal electrodes of micro-LEDs on the carrier substrate are aligned with electrodes on the receiving substrate and are bonded with the electrodes on the receiving substrate via the conductive photoresist, and the carrier substrate is a transparent substrate; selectively lifting-off micro-LEDs from the carrier substrate through laser lifting-off using a first laser; and separating the carrier substrate from the receiving substrate.

10 Claims, 3 Drawing Sheets

MICRO-LED TRANSFER METHOD, MANUFACTURING METHOD AND DISPLAY DEVICE

CROSS-REFERENCE TO RELATED APPLICATIONS

This application is a continuation of International Application No. PCT/CN2017/104036, filed on Sep. 28, 2017, which is hereby incorporated by reference in its entirety.

FIELD OF THE INVENTION

The present invention relates to the technical field of micro-LED display, and more specifically, to a method for transferring micro-LEDs, method for manufacturing a micro-LED display device and a micro-LED display device.

BACKGROUND OF THE INVENTION

The micro-LED technology refers to the LED array of small size integrated on a substrate with high density. As the development of micro-LED technology, it is expected in the industry that a high-quality micro-LED product would come into the market. High quality micro-LED will have a deep impact on the conventional display products such as LCD/OLED that have already been in the market.

In the process of manufacturing micro-LEDs, a micro-LED array is first formed on a carrier substrate. The carrier substrate can be a growth substrate or an intermediate substrate. Then, the micro-LED array is transferred to a receiving substrate of a display device. The receiving substrate can be a display screen or display panel, etc. The display device can be used in an electronic apparatus, such as a micro-display in an argument reality device or a virtual reality device, a watch, a mobile phone a television and so on.

FIG. 1 shows that micro-LEDs 106 on a carrier substrate 103 are being transferred to a receiving substrate 101. The carrier substrate 103 may be a sapphire substrate, for example. A thin film transistor (TFT) layer 102 is formed on the receiving substrate 101. Electrodes 104 are formed on top of the TFT layer 102. The micro-LEDs 106 include epitaxy layers 107 and metal electrodes 108.

Generally, the metal electrodes 108 are P-metal electrodes, and the electrodes 104 are anodes. Alternatively, the metal electrodes 108 are N-metal electrodes and the electrodes 104 are cathodes. Alternatively, the micro-LEDs 106 have a flip structure. In this situation, the metal electrodes 108 may include both P-metal electrodes and N-metal electrodes, and the electrodes 104 may include both anodes and cathodes.

The receiving substrate 101 and the carrier substrate 103 are bonded via a patterned bonding layer (solder) 105, such as solder bumps, resists, pastes, adhesives or polymers, and so on. Specifically, the metal electrodes 108 are bonded with the electrodes 104 via the bonding layer 105.

Laser lifting-off technology can be used in the transfer of micro-LEDs. After the micro-LEDs 106 are bonded with the receiving substrate 101, they can be lifted off by irradiating a laser from the carrier substrate side.

However, the bonding between the metal electrodes 108 and the electrodes 104 is weak. When the micro-LEDs 106 are lifted off from the carrier substrate 103 by using a laser lifting-off, the bonding may be broken and thus the yield loss may be high.

Therefore, there is a demand in the art that a new solution for transferring micro-LEDs shall be proposed to address at least one of the problems in the prior art.

SUMMARY OF THE INVENTION

One object of this invention is to provide a new technical solution for transferring micro-LEDs.

According to a first aspect of the present invention, there is provided 1. A method for transferring micro-LEDs, comprising: coating conductive photoresist on a receiving substrate, wherein the conductive photoresist is positive-tone photoresist; bonding a carrier substrate with the receiving substrate via the conductive photoresist, wherein metal electrodes of micro-LEDs on the carrier substrate are aligned with electrodes on the receiving substrate and are bonded with the electrodes on the receiving substrate via the conductive photoresist, and the carrier substrate is a transparent substrate; selectively lifting-off micro-LEDs from the carrier substrate through laser lifting-off using a first laser; and separating the carrier substrate from the receiving substrate.

Alternatively or optionally, the method further comprises: exposing the conductive photoresist and the micro-LEDs with ultraviolet light, wherein the metal electrodes are not transparent for the ultraviolet light. Optionally, epitaxy layers of the micro-LEDs are transparent for at least one component of the ultraviolet light.

Alternatively or optionally, the metal electrodes includes at least one of a P-metal electrode and a N-metal electrode.

Alternatively or optionally, the method further comprises: de-bonding the epitaxy layers of the micro-LEDs from the conductive photoresist by using a second laser for which the metal electrodes are not transparent and the epitaxy layers are transparent.

Alternatively or optionally, wavelength of the second laser is larger than 365 nm.

Alternatively or optionally, the carrier substrate is a sapphire substrate and the epitaxy layers are GaN layers.

Alternatively or optionally, the method further comprises: stripping off the conductive photoresist on the receiving substrate.

Alternatively or optionally, the first laser has a wavelength of 193 nm, 248 nm or 308 nm.

According to a first aspect of the present invention, there is provided a method for manufacturing a micro-LED display device, including: transferring micro-LEDs from a carrier substrate to a receiving substrate of the display device by using the above method.

According to a first aspect of the present invention, there is provided a micro-LED display device manufactured by using the above method.

According to an embodiment of this invention, the present invention can improve the bonding strength between micro-LEDs and the receiving substrate during a transfer using a laser lifting-off.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
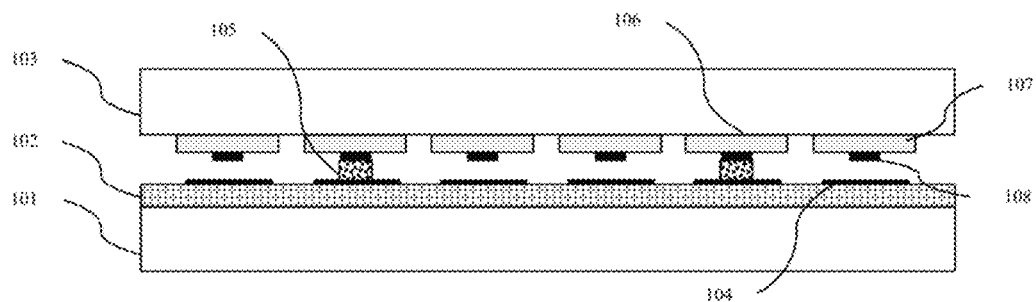
FIG. 1 schematically shows a prior art laser lifting-off process.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Examples and embodiments will be described below with reference to the figures.

FIGS. 2-10 schematically show a process of transferring micro-LEDs according to an embodiment of this disclosure.

Figure 2:
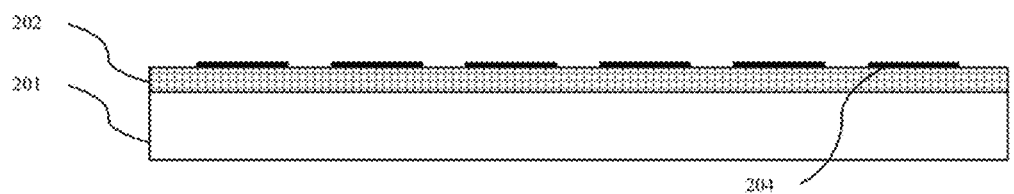
FIGS. 2-10 schematically show a process of transferring micro-LEDs according to an embodiment of this disclosure.

As shown in FIG. 2, a receiving substrate 201 is prepared. A TFT layer 202 may be formed on top of the receiving substrate 201. Electrodes 204 may be formed on top of the TFT layer 202. Preferably, the electrodes 204 are anodes. Alternatively, they can be cathodes, or can include both anodes and cathodes for micro-LEDs of flip structure. The preparation of the receiving substrate 201 can be performed in a prior art manner and thus will not be described in detail here.

Figure 3:
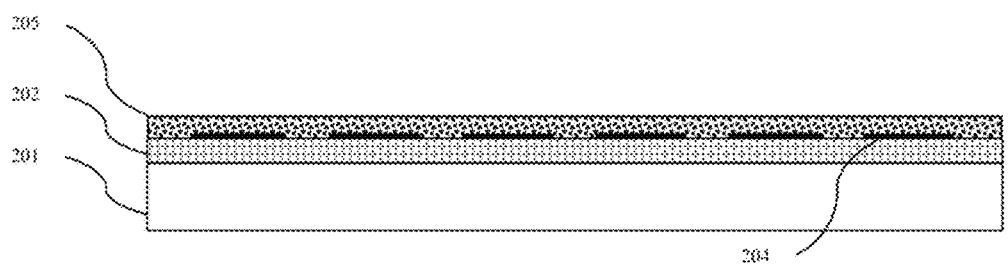

As shown in FIG. 3, conductive photoresist 205 is coated on the receiving substrate 201. The conductive photoresist is positive-tone photoresist. For example, the conductive photoresist 205 can be a mixture of commercial photoresist and conductive nano-particle powder such as silver, carbon or other metals/alloys.

As appreciated by a person skilled in the art, the conductive photoresist 205 can be soft-baked.

The conductive photoresist 205 is coated on the receiving substrate 201, so that the conductive photoresist 205 can be placed on the receiving substrate 201 in a blanked manner. This will simplify the manufacturing process, compared with a patterned bonding layer of the prior art.

Figure 4:
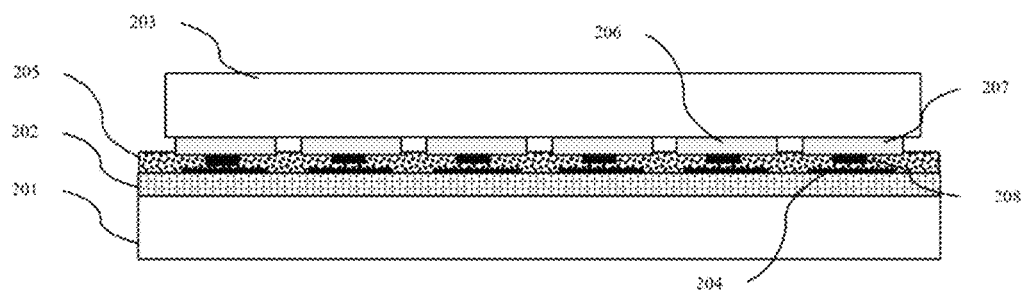

As shown in FIG. 4, a carrier substrate 203 is bonded with the receiving substrate 201 via the conductive photoresist 205.

For example, the bonding is a low temperature (close to room temperature) process with pressure. For example, it is performed at 20-100' C, or preferably 20-50' C.

Micro-LEDs 206 are formed on the carrier substrate 203. The micro-LEDs 206 include epitaxy layers 207 and metal electrodes 208. The metal electrodes 208 of micro-LEDs on the carrier substrate are aligned with electrodes 204 on the receiving substrate and are bonded with the electrodes 204 on the receiving substrate via the conductive photoresist 205. As explained above, the metal electrodes 206 may include at least one of a P-metal electrode and a N-metal electrode.

The carrier substrate 203 is a transparent substrate, which is suitable for laser lifting-off. For example the carrier substrate 203 is a sapphire substrate. The epitaxy layers 207 can be GaN layers.

The conductive photoresist 205 can be stripped off as needed in a prior art manner. It can be patterned by using a mask and then be stripped off. Alternatively, they can be kept on the receiving substrate 201 as a common electrode.

Figure 5:
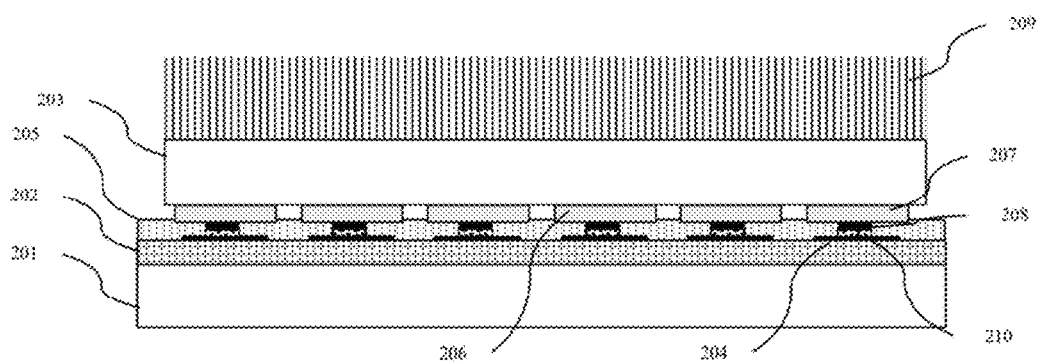

Alternatively, a new approach is proposed in FIG. 5. As shown in FIG. 5, the conductive photoresist 205 and the micro-LEDs 206 are exposed with ultraviolet light 209. The metal electrodes 208 are not transparent for the ultraviolet light 209.

In such a situation, the metal electrodes 208 act as a mask for the conductive photoresist. This is a kind of self-aligned photoresist exposure and auto masking by the metal electrodes. The exposing can be performed in a blanked manner, which is simple. The exposed conductive photoresist can be easily stripped off after the transfer. The processing of patterning can be omitted. This will simplify the processing of the transferring.

Optionally, the epitaxy layers 207 of the micro-LEDs 206 are transparent for at least one component of the ultraviolet light 209. For example, the material of the epitaxy layers 207 is GaN, and is transparent for the components of the ultraviolet light 209 with wavelengths larger than 365 nm. In such a situation, the conductive photoresist under the epitaxy layers 207 can also be stripped off after transfer.

As shown in FIG. 5, after being exposed with the ultraviolet 209, the exposed portion of the conductive photoresist is modified to be suitable for stripping-off while the portions under the metal electrodes 208 are un-modified and will be kept after stripping-off.

It will be appreciated by a person skilled in the art that, although it is shown in FIG. 5 that the ultraviolet light 209 is irradiated via the carrier substrate 203, this exposing process can also be performed after the carrier substrate 203 is separated from the receiving substrate 201.

Figure 6:
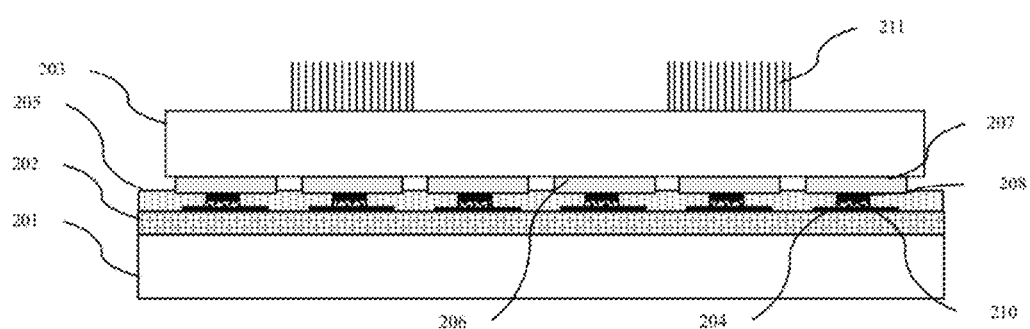

As shown in FIG. 6, micro-LEDs 206 are selectively lifted-off from the carrier substrate 203 through laser lifting-off using a first laser 211.

The epitaxy layers 207 are not transparent for the first laser 211. The first laser will function at the interface between the carrier substrate 203 and the epitaxy layers 207 to lift off the selected micro-LEDs. For example, the first laser 211 has a wavelength of 193 nm, 248 nm or 308 nm. For example, an excimer laser can be used.

The conductive photoresist 205 will absorb some of the stress during the laser lifting-off so that the connection between the metal electrodes 208 and the electrodes 204 can be protected. As a result, the mechanical damage induced by the laser lifting-off is minimized due to the robust support on the micro-LEDs by the conductive photoresist. This will reduce the yield loss.

Figure 7:
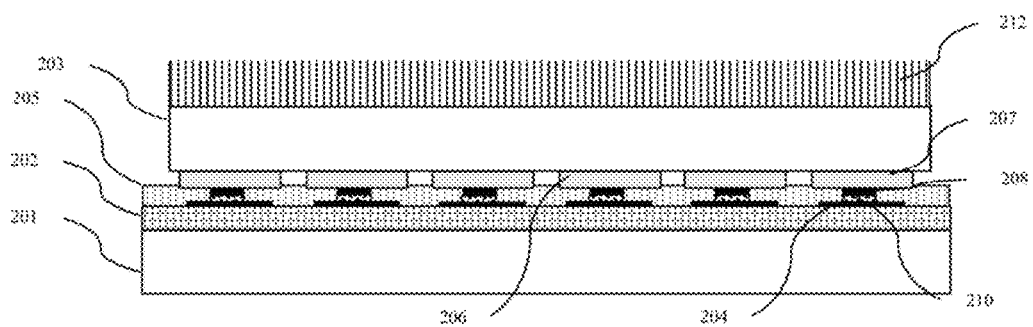

Optionally, as shown in FIG. 7, the epitaxy layers 207 of the micro-LEDs 206 can be de-bonded from the conductive photoresist 205 by using a second laser 212. For the second laser 212, the metal electrodes 208 are not transparent and the epitaxy layers 207 are transparent. For example, the wavelength of the second laser 212 is larger than 365 nm, and the epitaxy layers 207 (GaN, for example) as well as the carrier substrate 203 (sapphire, for example) are transparent.

In such a manner, the epitaxy layers 207 are separated from the conductive photoresist 204 at the interface therebetween. So, it will be easy to separate the un-selected micro-LEDs from the receiving substrate 201.

Figure 8:
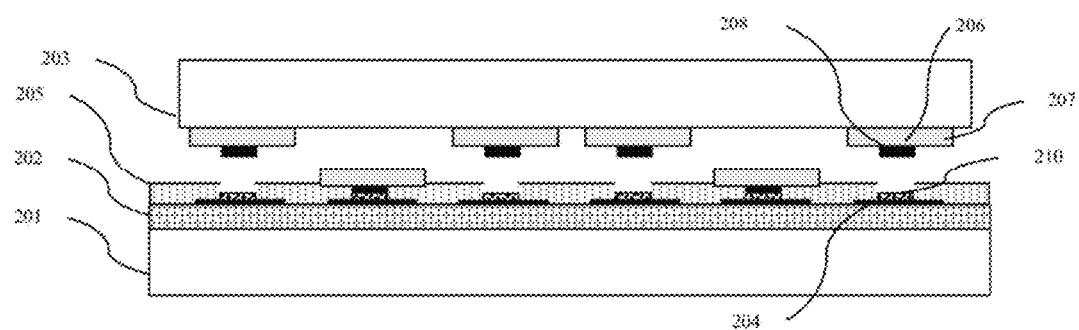

As shown in FIG. 8, the carrier substrate 203 is separated from the receiving substrate 201. The selected (lifted-off) micro-LEDs 206 are kept on the receiving substrate 201 and the metal electrodes 208 thereof are connected with the electrodes 204 via the un-modified conductive photoresist 210.

The un-lifted-off micro-LEDs still have a strong bonding between the epitaxy layer 207 and the carrier substrate 203. They will be separated from the receiving substrate 201 with the carrier substrate 203.

Figure 9:
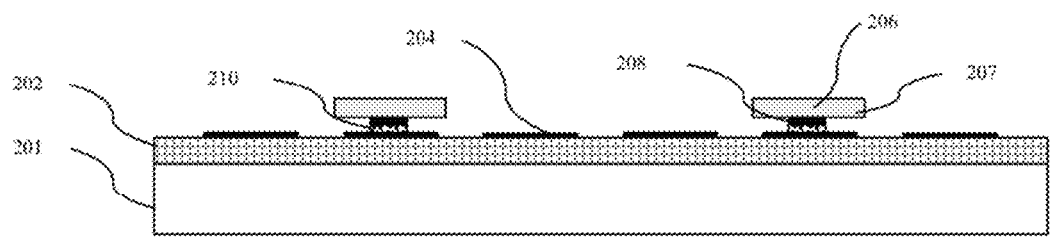

As shown in FIG. 9, the conductive photoresist 205 on the receiving substrate is stripped-off. The un-modified conductive photoresist 210 is left between the metal electrodes 208 and the electrodes 204. For example, the conductive photoresist 205 can be stripped off by using a dry etching by using O$_2$ plasma, or RIE (Reactive Ion Etching) and so on, or by a wet etching by using developer or stripper with controlled time.

Figure 10:
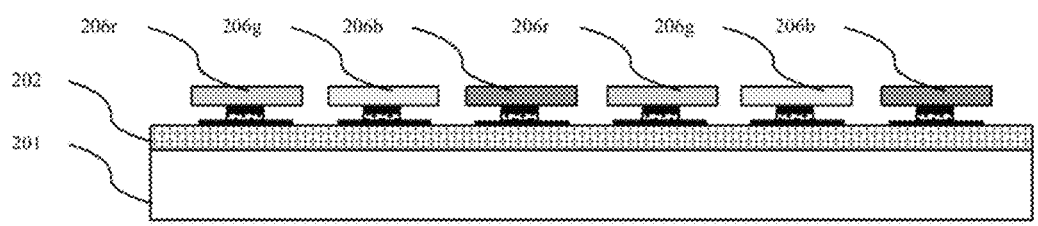

As shown in FIG. 10, the micro-LEDs of different colors can be transferred one color by one color. For example, the red micro-LEDs are first transferred by using the above processes, the green micro-LEDs are then transferred by using the above processes, and the blue micro-LEDs are finally transferred by using the above processes.

In another aspect of this disclosure, the transferring method can be used in a method for manufacturing a micro-LED display device. For example, the method can include: transferring micro-LEDs from a carrier substrate to a receiving substrate of the display device by using the method described above. The display device may a display screen or display panel, for example.

In still another aspect of this disclosure, a micro-LED display device manufactured by using the above method or manufacturing a micro-LED display device.

Although some specific embodiments of the present invention have been demonstrated in detail with examples, it should be understood by a person skilled in the art that the above examples are only intended to be illustrative but not to limit the scope of the present invention.

What is claimed is:

1. A method for transferring micro-LEDs, comprising:
    coating conductive photoresist on a receiving substrate, wherein the conductive photoresist is positive-tone photoresist;
    bonding a carrier substrate with the receiving substrate via the conductive photoresist, wherein metal electrodes of micro-LEDs on the carrier substrate are aligned with electrodes on the receiving substrate and are bonded with the electrodes on the receiving substrate via the conductive photoresist, and the carrier substrate is a transparent substrate;
    selectively lifting-off micro-LEDs from the carrier substrate through laser lifting-off using a first laser; and
    separating the carrier substrate from the receiving substrate.

2. The method according to claim 1, further comprising:
    exposing the conductive photoresist and the micro-LEDs with ultraviolet light, wherein the metal electrodes are not transparent for the ultraviolet light.

3. The method according to claim 1, wherein the metal electrodes includes at least one of a P-metal electrode and a N-metal electrode.

4. The method according to claim 1, further comprising:
    de-bonding the epitaxy layers of the micro-LEDs from the conductive photoresist by using a second laser for which the metal electrodes are not transparent and the epitaxy layers are transparent.

5. The method according to claim 4, wherein wavelength of the second laser is larger than 365 nm.

6. The method according to claim 2, wherein the carrier substrate is a sapphire substrate and the epitaxy layers are GaN layers.

7. The method according to claim 1, further comprising:
    stripping off the conductive photoresist on the receiving substrate.

8. The method according to claim 1, wherein the first laser has a wavelength of 193 nm, 248 nm or 308 nm.

9. A method for manufacturing a micro-LED display device, including: transferring micro-LEDs from a carrier substrate to a receiving substrate of the display device by using the method according to claim 1.

10. A micro-LED display device manufactured by using the method according to claim 9.

* * * * *